United States Patent
Toth et al.

(10) Patent No.: US 6,768,433 B1
(45) Date of Patent: Jul. 27, 2004

(54) METHOD AND SYSTEM FOR DECODING BIPHASE-MARK ENCODED DATA

(75) Inventors: Zoltan Toth, Sunnyvale, CA (US); Kenneth D. Smith, Jr., Mountain View, CA (US); Hung B. Vo, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/672,752

(22) Filed: Sep. 25, 2003

(51) Int. Cl.[7] .............................................. H03M 1/22
(52) U.S. Cl. ..................... 341/105; 341/70; 375/361; 375/282; 375/333
(58) Field of Search .................... 341/105, 61; 375/361, 375/282, 333

(56) References Cited

U.S. PATENT DOCUMENTS

| | | | | |
|---|---|---|---|---|
| 5,371,799 A | * | 12/1994 | Lowe et al. | 381/310 |
| 5,404,362 A | * | 4/1995 | Meitner | 375/371 |
| 5,436,975 A | * | 7/1995 | Lowe et al. | 381/17 |
| 5,459,765 A | * | 10/1995 | Meyer et al. | 375/360 |
| 5,598,446 A | * | 1/1997 | Van Der Tuijn | 375/373 |
| 5,671,258 A | * | 9/1997 | Burns et al. | 375/359 |
| 5,889,820 A | * | 3/1999 | Adams | 375/361 |
| 6,008,746 A | * | 12/1999 | White | 341/70 |
| 6,487,263 B1 | | 11/2002 | Bianchessi et al. | 375/361 |

OTHER PUBLICATIONS

"Digital Audio Interface Receiver 5," Yamaha LSI, YSD917, Yamaha Corporation, pp. 1–9, Jun. 2001.
Sanchez, Cliff et al, "Overview of Digital Audio Interface Data Structures," Cirrus Logic, Inc., Feb. 1998, pp. 1–8.
"High Feature 96kHz 24 bit DIR," AKM, Jul. 2002, pp. 1–30.
"86 kHz Digital Audio Interface Receiver," Cirrus Logic, Inc., Jan. 2003, pp. 1–42.

* cited by examiner

*Primary Examiner*—Michael Tokar
*Assistant Examiner*—Lam T. Mai
(74) *Attorney, Agent, or Firm*—Sawyer Law Group LLP

(57) ABSTRACT

A method and system for decoding a biphase-mark input stream is disclosed. Aspects of the present invention include receiving an external biphase-mark input stream by a receiver module; recovering timing information from the input stream; decoding the input stream to generate decoded data and storing the decoded data in a data buffer; reading, by an audio out module, the decoded data from the data buffer at a rate determined by a programmable clock; using the timing information from the receiver module to calculate a sampling frequency of the input stream; and adjusting a frequency of the programmable clock to substantially match the sampling frequency so that the audio out module reads the decoded from the buffer at substantially the same rate that the receiver module inputs the decoded data into the data buffer.

39 Claims, 5 Drawing Sheets

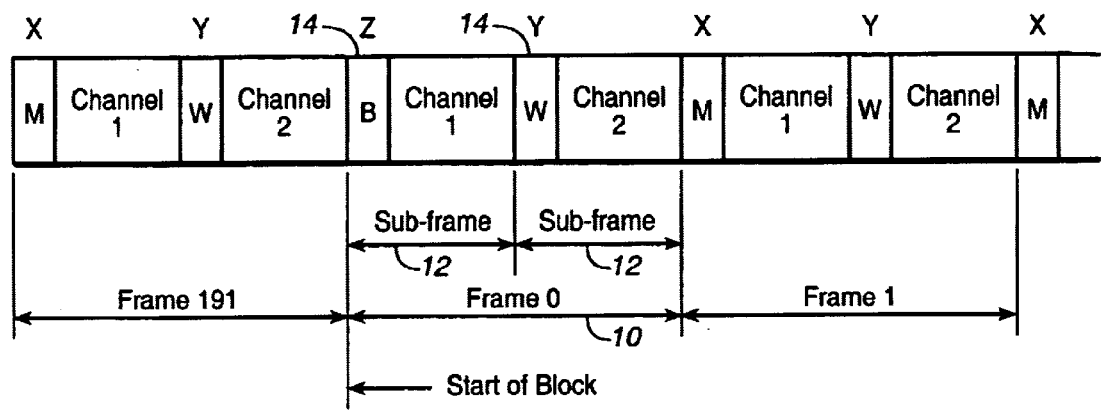
FIG._1
(PRIOR ART)
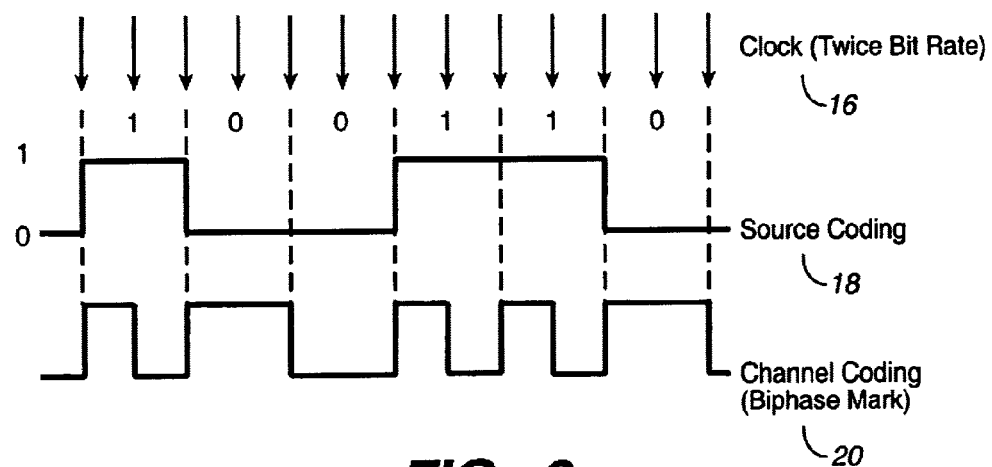
FIG._2
(PRIOR ART)

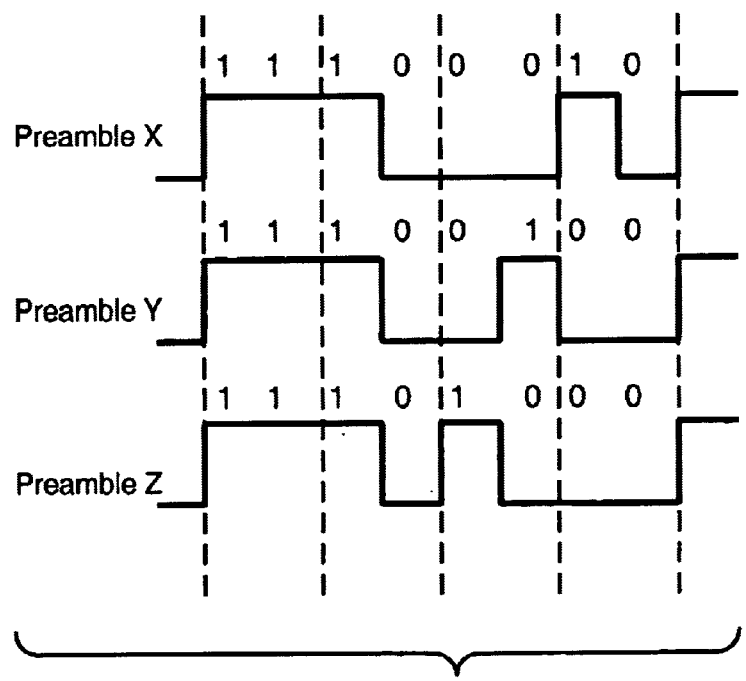
FIG._3
(PRIOR ART)
FIG._4
(PRIOR ART)

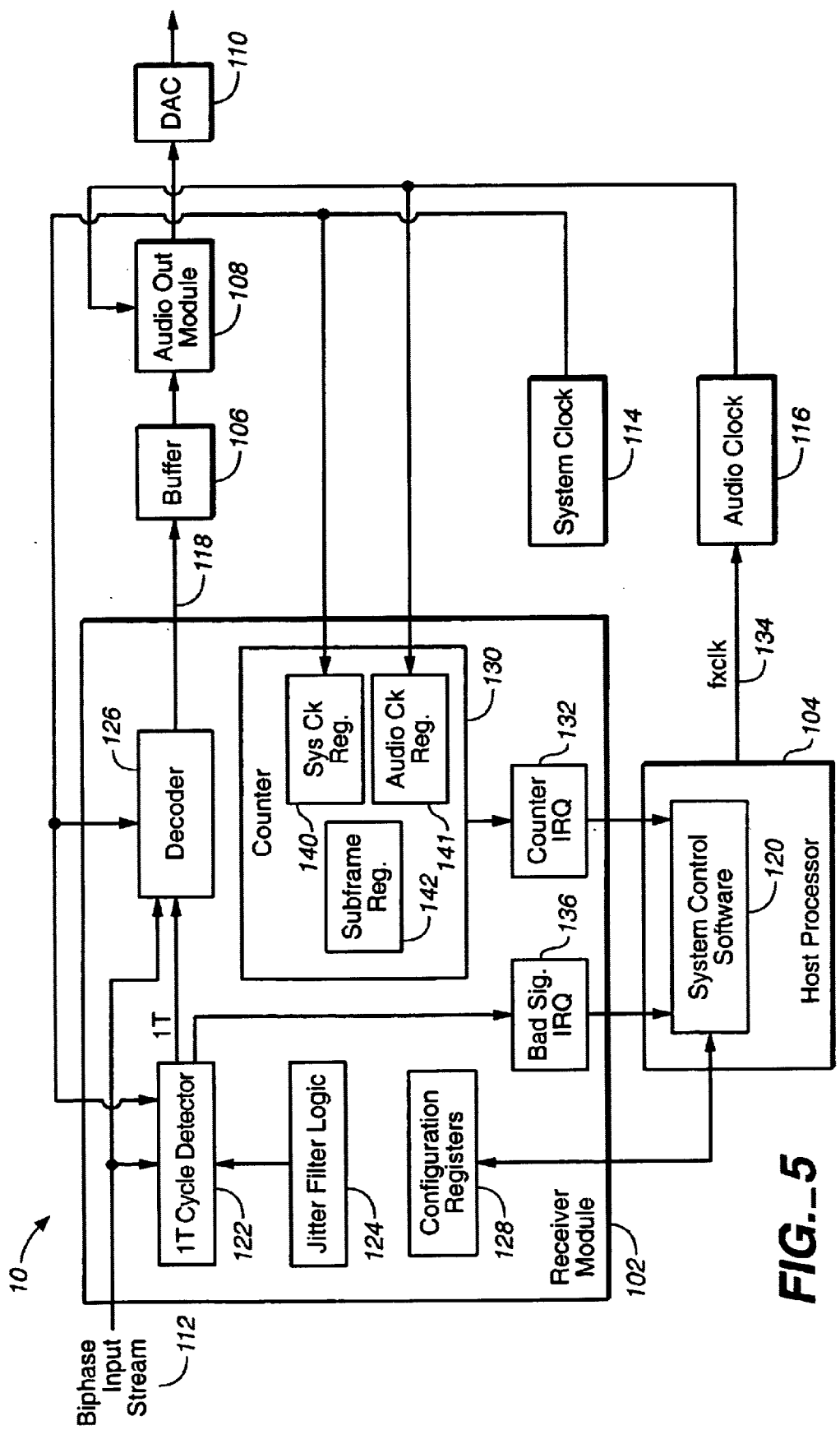
FIG._5

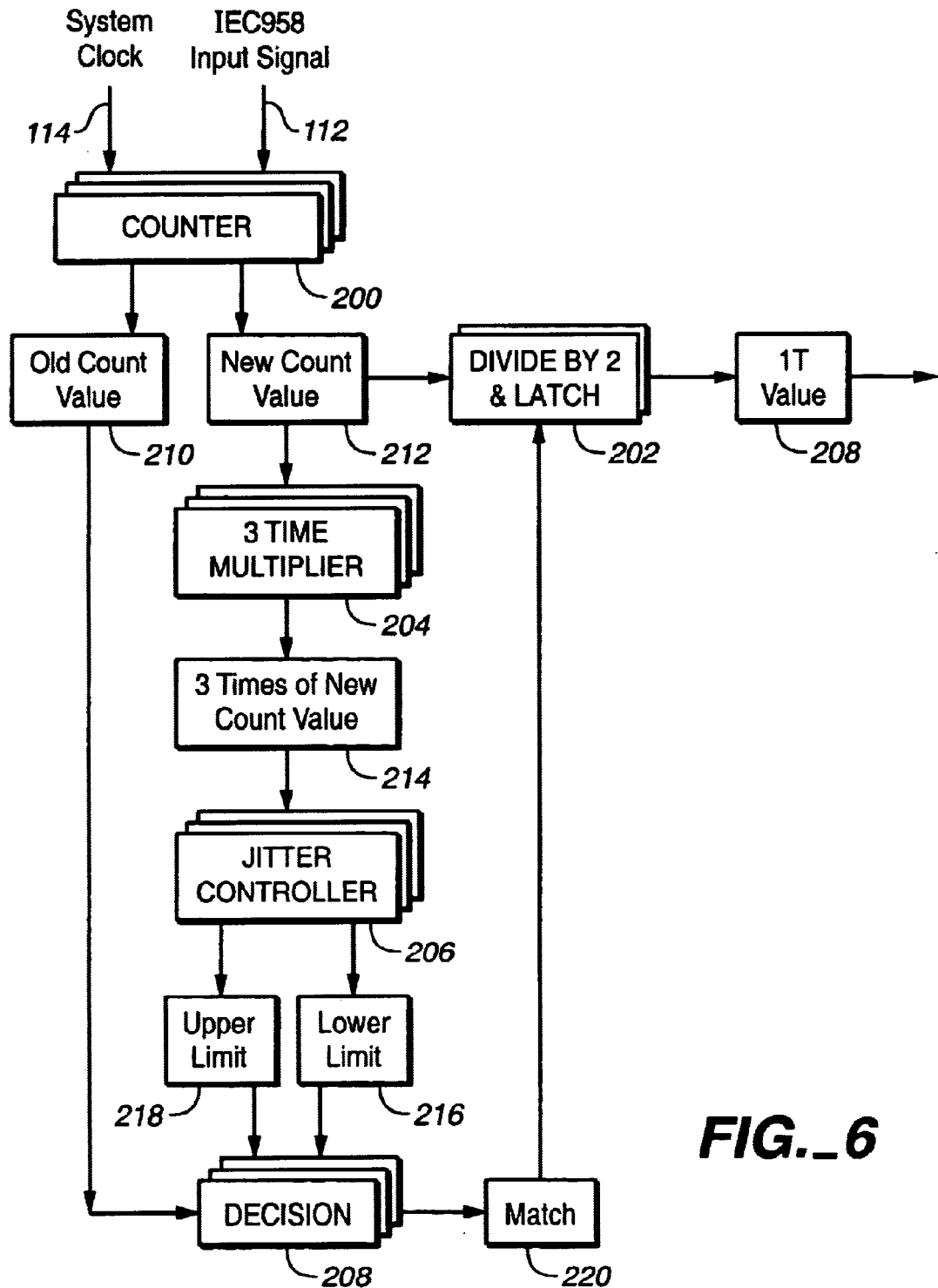
FIG._6

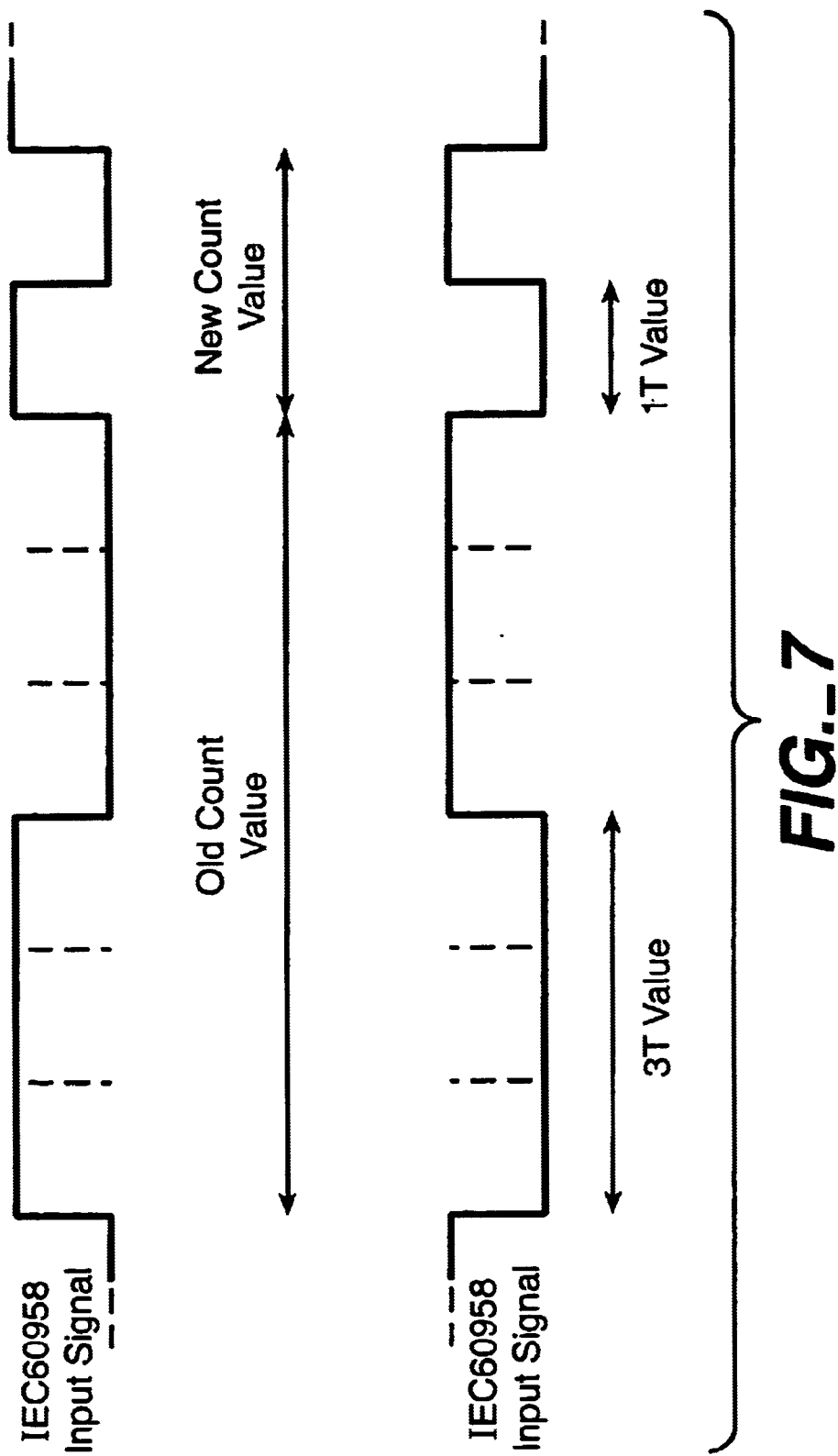
FIG._7

METHOD AND SYSTEM FOR DECODING BIPHASE-MARK ENCODED DATA

FIELD OF THE INVENTION

The present invention relates to decoding a digital audio data stream, and more particularly to decoding a biphase-mark encoded data stream in the digital domain using a software-based frequency locked loop.

BACKGROUND OF THE INVENTION

Digital audio receivers that receive and decode digital audio data are used in a variety of consumer and professional audio products such as audio/video receivers, DVD players and recorders, and personal video recorders, for example. Several audio interfaces exist to allow different devices to communicate digital audio data with one another. The worldwide audio standard is referred to the as International Electrotechnical Commission 60958 (IEC-60958). Two related standards include the Audio Engineering Society's AES3 standard, and the Sony/Philips Digital Interface (S/PDIF). One commonality among these standards is that they modulate the signal using biphase-mark encoding (or simply biphase encoding) to transmit digital audio information in serial format.

Biphase-mark encoded standards require that the digital audio data be transmitted in blocks, where each block comprises 192 consecutive frames for each of two channels. FIG. 1 is a diagram illustrating the IEC958 frame format. A frame 10 comprises two sub-frames 12, one for each channel. The rate of transmission of the frames corresponds to the source sampling frequency. Samples of the audio signal are transmitted in two channels, and a receiver is able to extract the clock from the transmitted signal. Each sub-frame 12 is divided into thirty-two time slots for storing data bits. The first four bits form a preamble, the following four bits include auxiliary data, the following twenty bits contain an audio sample, and the last four bits contain control information.

To facilitate clock recovery from the data stream and to minimize the DC component on the transmission line, time slots 4 to 31 are encoded in biphase-mark. Each time slot, which transmits one bit of data, always starts with a transition or edge of the signal and ends with a transition of the signal. Further, each time slot is represented by two consecutive binary states, where the occurrence of a transition in the middle of a given time slot indicates that a "1" is encoded, while the absence of a transition in a time slot indicates that a "0" is encoded FIG. 2 illustrates an example of biphase-mark encoding. A clock signal 16 is shown for reference. An example set of source data 18 is shown that is to be encoded, followed by example encoded data 20 after biphase-mark encoding. The example clock rate is twice the data transmission rate. Each bit from the source data 18 is transmitted in the encoded data 20 in a time slot of length T. As shown, "1s" in the source data 18 are encoded in the encoded data 20 with transitions occurring at 0.5T, while the "0s" have no transition.

Referring again to FIG. 1, the preambles 14 of each sub-frame 12 are specific patterns that provide synchronization and identification of sub-frames 12 and blocks. This allows the receiver to lock onto the data sample within one sub-frame frame 12.

FIG. 3 is a block diagram illustrating the three preambles used to identify the beginning of the sub-frames and blocks; and FIG. 4 shows relative waveforms for the preambles. There are three defined preambles 14: one for each channel and one to indicate the beginning of a channel and a block. The corresponding channel coding for each of the preambles 14 is also shown. Preamble "B" represents the beginning of channel A and a block. Preamble "M" represents the beginning of channel A only. And preamble "W" represents the beginning of channel B. In broadcasting environments, the letters B, M, and W are denoted by Z, X, and Y, respectively.

So that they can be easily identified by the receiver, each preamble 22 contains biphase coding violations, as shown in FIG. 4. Biphase-mark data is required to transition at every time slot, but each preamble 22 violates that requirement twice because each preamble 22 has two time slots, or bit boundaries, with no transitions.

Biphase-mark encoding has the advantage of providing a self-clocking data signal. Conventional digital audio receivers typically include an analog phase-locked loop (PLL) to recover the clock signal from the data signal. The PLL includes a digital edge-triggered phase detector coupled to a voltage-controlled oscillator. Through a feedback loop, the voltage-controlled oscillator is used to generate an independent clock signal having a frequency designed to match the clocking of incoming biphase-mark encoded data signal.

Although conventional digital audio receivers work for their intended purposes, the sampling frequency of incoming digital audio data may change significantly. In addition, the signal may suffer from jitter and noise, making it even more difficult for the digital audio receiver to decode the audio data. Because the PLL's used in conventional digital audio receivers are analog, these receivers take longer to adapt to the changing input sampling frequency due to low pass filter characteristics. If the digital audio receiver is incapable of keeping up with the changing sampling frequency of the input signal, then unsatisfactory decoding of the digital audio signal will result.

Accordingly, what is needed is an improved method and system for decoding biphase encoded data. The present invention addresses such a need.

SUMMARY OF THE INVENTION

The present invention provides a method and system for decoding a biphase-mark encoded input stream. Aspects of the present invention include receiving an external biphase-mark input stream by a receiver module; recovering timing information from the input stream; decoding the input stream to generate decoded data and storing the decoded data in a data buffer; reading, by an audio out module, the decoded data from the data buffer at a rate determined by a programmable clock; using the timing information from the receiver module to calculate a sampling frequency of the input stream; and adjusting the frequency of the programmable clock to substantially match the sampling frequency so that the audio out module reads the decoded data from the buffer at substantially the same rate that the receiver module inputs the decoded data into the data buffer.

According to the method and system disclosed herein, the present invention decodes the biphase input stream entirely in the digital domain using a software-based frequency locked loop, which matches the frequency of the programmable clock with the sampling frequency of the input stream in order to synchronize the audio out module with the receiver module.

BRIEF DESCRIPTION OF THE DRAWINGS

FIG. 1 is a diagram illustrating the IEC-60958 frame format.

FIG. 2 illustrates an example of biphase-mark encoding.

FIG. 3 is a block diagram illustrating the three preambles used to identify the beginning of the sub-frames and blocks.

FIG. 4 shows relative waveforms for the preambles.

FIG. 5 is a diagram illustrating an integrated biphase decoding system in accordance with one preferred embodiment of the present invention.

FIG. 6 is a diagram illustrating components and process flow for the 1T cycle detector and the Jitter Filter Logic module.

FIG. 7 is a diagram illustrating waveforms of the "X" preamble.

DETAILED DESCRIPTION OF THE INVENTION

The present invention relates to a method and system for decoding biphase encoded data. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a biphase-mark decoding system. The system includes a digital audio receiver that may be integrated with an audio video decoder for decoding a biphase-mark input stream in the digital domain and without the use of an analog PLL.

FIG. 5 is a diagram illustrating an integrated biphase-mark decoding system in accordance with one preferred embodiment of the present invention. The biphase-mark decoding system 100 includes a digital audio receiver module 102 coupled to a host processor 104. The host processor 104 is shared between audio and video chips (not shown), and executes system control software 120. The system control software 120 performs a variety of functions for controlling the digital audio receiver module 102, including implementation of the frequency locked loop (FLL).

Input to the receiver module 102 includes a digital audio data stream 112, which is biphase-mark encoded, preferably using the IEC60958, AES3, or S/PDIF standards. The input stream 112 is typically input to the system 100 through an optical or coaxial 75-ohm cable from a device, such as a DVD or CD player, for example.

Also input to the receiver module 102 for timing control are two clocks: a system clock (SYSCLK) 114, and an audio clock (XCK) 116. The system clock 114 is an on chip clock and is not programmable by the host processor 104. The audio clock 116 is also an on chip clock and it is implemented as a programmable clock oscillator. In a preferred embodiment, the system clock 114 is capable of significantly higher frequencies than the audio clock 116. For example, the system clock 114 may reach frequencies of approximately 148 MHz, while the audio clock 116 may only reach frequencies up to approximately 38 MHz.

According to the present invention, the receiver module 102 uses either the system clock 114 or the audio clock 116 to recover timing information from the input data stream 112. In a preferred embodiment, the system clock 114 is used for decoding data because it provides the highest precision, and the audio clock 116 is only used for rate control by the audio clock register 141, as described below. The decoder 126 then uses a portion of that timing information to decode the data stream 112, and the decoder 126 stores the decoded audio data 118 in a data buffer 106. The audio out module 108 then reads the decoded data 118 from the data buffer 106 at a rate determined by the audio clock 116, and outputs the data in framed serial format to a digital-to-analog converter (DAC) 110 for subsequent delivery to a device, such as an amplifier and a speaker.

The system control software 120 uses the timing information gathered by the receiver module to calculate the sampling frequency of the input stream 112 and then adjusts (increases or decreases) the frequency of the audio clock 116 to substantially match the input sampling frequency. By using a software-based FLL to cancel any error between the audio clock 116 and the sampling frequency of the input stream, the present invention ensures that the audio out module 108 reads the decoded audio data 118 from the buffer 106 at substantially the same rate that the receiver module 102 inputs the audio data 18 into the data buffer 106.

According to the present invention, the software-based frequency locked loop implemented by the system control software 120 provides a method for adjusting characteristics of the receiver module 102 to obtain the best trade-off between jitter and noise tolerance, as explained further below.

The receiver module 102 includes a 1T cycle detector 122, jitter filter logic 124, a decoder 126, CONFIGURATION registers 128, a counter module 130 and a counter interrupt 132. The receiver module 102 functions according to values of one or more of the CONFIGURATIONregisters 128, which are set by the system control software 120.

In operation, the 1T cycle detector 122 and the jitter filter logic 124 are used to first establish 1T timing of the input stream 112. The system control software 120 in conjunction with the counter module 130 then establish the sampling frequency of the input stream 112 using either the system clock 114 or the audio clock 116. Based on this timing information, the decoder 126 can decode the input stream 112 and fills the buffer 106 at a rate corresponding to the rate of the input stream 112. The audio out module 108 then reads the data from the data buffer 106 at a rate set by the audio clock 116.

As the input stream 112 is received, the receiver module 102 uses either the system clock 114 or the audio clock 116 to recover timing information from the input stream 112. The receiver module 102 feeds the timing information back to the system control software 120 as a frequency count. The system control software 120 compares this frequency count with an expected value and calculates the difference. The system control software 120 then adjusts (increases or decreases) the frequency of the audio clock 116 according to this difference via an output clock frequency control register (fxck) 132 to substantially match the sampling frequency of the input and the output.

As explained further below, the timing information reported to the system control software 120 includes a count of the number of clock cycles, and a count of the number of sub-frames detected in the input signal. These two counts are used by the system control software 122 to determine the sampling frequency of the input stream 112.

Although the system clock 114 is not programmable, its frequency is much higher than that of the audio clock 116 and therefore it is used to determine the sampling frequency of the input stream 112 at system startup when the frequency of the input stream 112 is still unknown, or when the input sampling frequency is very high and the system 10 cannot keep up because the audio clock 116 has too few clock cycles within the measurement interval. Due to its higher frequency, the system clock 114 provides a higher resolution than the audio clock 116, and therefore results in a more accurate measurement.

When the system 10 starts, the system control software 120 makes an assumption about the sampling frequency of the input stream 112. For example, a default sampling frequency of 48 kHz may be assumed. Once timing has been established, the system control software 120 may transition from using the system clock 114 to using the audio clock 116 to continue establishing timing of the input stream 112.

It should be noted that when the system clock 114 is used by the system control software 120 to implement the FLL, the FLL forms an open loop because the frequency of the system clock 114 cannot be changed by the system control software 120. However, when the audio clock 116 is used, the FLL forms a closed loop because the frequency of the audio clock 116 is adjustable by the system control software 120 to reduce the error between the audio clock 116 and the calculated sampling frequency of the input stream 112.

The operation of the decoding system 10 will now be explained in further detail. The receiver module 102 begins by converting the asynchronous IEC60958 input stream 112 into a synchronous input stream 112 for internal use. Processing of the input stream 112 begins with recovering the clock by sensing the frame and block synchronization patterns, which identify the location of each channel. This is referred to as 1T timing information. Given the asynchronous IEC60958 input stream 112, the 1T cycle detector 122, which is controlled by the jitter filter logic 124, measures the duration of the 1T interval (also called unit interval) in the input stream 112. When the 1T cycle detector 122 completes detecting the 1T timing in the input stream 112, the incoming data can be accurately sampled and the audio clock 116 should be synchronized with the timing in the input stream 112.

The input stream 112 inherently includes jitter and noise. Jitter and noise affect the rising and falling edges of the signal, making clock recovery difficult because the slopes of the edges in each timing interval may be different.

According to the present invention, the jitter filter logic 124 and the 1T cycle detector 122 accurately recover the clock through a combination of the following features:

1) adaptive jitter tolerance;
2) extracting the 1T timing of the input stream 112 only from the "M" or "X" preamble patterns 11100010 or 00011101; and
3) by measuring the timing intervals by measuring the time between pairs of consecutive edges of the same type in the signal, rather than measuring the time between pairs of consecutive rising and falling edges, as explained below.

Adaptive Jitter Tolerance

The adaptive jitter tolerance of the jitter filter logic 124 provides the 1T cycle detector 122 with an adjustable jitter window for accepting clock edges that arrive early or late. This allows the 1T cycle detector 122 to adapt to the sampling frequency of the input stream 112, which, can vary from 32 kHz to 192 kHz. In a preferred embodiment, the jitter window is established by measuring 1T timing as a predefined number of system clock cycles, such as 15 cycles for example. The system control software 120 then divides the number of clock cycles by any number divisible by two to provide a jitter window that is proportional to the input sampling frequency. Using a number divisible by 2 simplifies the implementation because the division can be carried out by bitwise shifting the number of clock cycles towards the least significant bity. Such a method of division results in a logarithmic set of steps which is optimal for cost and performance.

For example, dividing the number of cycles by 2 provides a jitter window that is 50 percent of the sampling frequency. Preferably, an optimal jitter window may be created by dividing the number of cycles by 8 to provide a jitter window that is 12.5% of the sampling frequency. For a sampling frequency of time T, this means that a legal edge transition is recognized anytime within T/8.

The jitter window is defined by determining a lower and upper limit of the 1T interval. In a preferred embodiment, the lower and upper limit of the 1T interval is based on a value of a jitter control register (not shown) in the CONFIGURATIONregisters 128 set by the system control software 120.

1T Timing

Given the lower and upper limit from the jitter filter logic 124, the 1T cycle detector 122 processes the input stream 112. The 1T cycle detector 122 decides the 1T interval that satisfies the jitter requirement. There are two windows in the input stream 112 that are monitored; a preamble window in which a preamble pattern should appear, and a data window in which data should appear. In the data window, the duration of each signal transition from high-to-low or low-to-high is either 1T or 2T. In the pre-amble window, a 3T transition happens with a unique pattern.

According the present invention, the 1T cycle detector 122 extracts the 1T timing of the input stream 112 only from the "M" or "X" preamble pattern (11100010 or 00011101). The 1T cycle detector 122 accomplishes this by looking for two consecutive 3T's, or 6T, followed by a 2T pattern. The search method is to look for the 6-to-2 timing ratio in this sequence, which can only happen during the 3T-3T-1T-1T pattern of the "M" or "X" preamble. Once this pattern is found, the 2T value is divided by 2 to yield the 1T value. In an alternative embodiment, once the 8T pattern of 3T-3T-1T-1T is found, the 8T value could be divided by 8 to yield the 1T value.

Every time a 6T-2T sequence appears, the 1T interval value is updated. The 1T interval value may be updated either by overwriting the previous 1T value or by averaging the current and previous 1T values. Based on the stored 1T value, a signal is sent to the decoder module 126 which is sampled in the middle of every 1T interval detected in the input stream 112.

FIG. 6 is a diagram illustrating components and process flow for the 1T cycle detector 122. The internal architecture of 1T cycle detector 122 includes a counter 200, a 3-times multiplier 204, a jitter controller 206, a decision block 208, and a divide by two & latch block 202. An explanation of these functional blocks will follow the data path of the signal.

The 1T cycle detector 122 accepts two inputs, the system clock 114 and the input stream 112, and generates "1T value" as its output. The 1T cycle detector 122 tries to extract the "1T value" from the detected "X" or "M" preamble pattern, 11100010 or 00011101.

The counter 200 measures the time interval between edge transitions in the input stream 112 by counting system clock cycles 114. However, instead of measuring pairs of adjacent rising and falling edges, the counter 200 counts the number of system clock 114 cycles occurring between transitions of adjacent edges of the same type (both rising or both falling). This is done to prevent any differences between rise and fall times from translating into input jitter. Receivers often employ hysteresis to reduce their susceptibility to input noise. Even ordinary receivers exhibit some form of hysteresis. Unfortunately, hysteresis makes the receiver susceptible to differences in the rise and fall times of the signal. Consequently, measuring timing between consecutive rising and falling edges may increase the jitter of the signal as seen by the receiver, rendering it less tolerant to jitter originating at the source. Counting the number of system clock 114 cycles occurring between transitions of adjacent edges of the same type in accordance with the present invention eliminates this error.

The output of the counter 200 are an old count value 210 and a new count value 212. FIG. 7 is a diagram illustrating waveforms of the "X" preamble. As shown, the old count value 210 represents the number of system clock 114 cycles occurring during the 6T (3T+3T) interval of the "X" preamble. The new count value 212 represents the number of system clock 114 cycles occurring during the subsequent 2T (1T+1T) interval.

The 3-time multiplier 204 multiplies the new count value 212 by 3, and produces the result 3 times of new count value 214. The jitter controller 206 retrieves the jitter window setting (e.g. +/−12.5%) from a register that is set by the system control software 120 while the input stream is being processed. The jitter controller 206 adds the jitter window setting to the 3-times of the new count value 216 in order to produce the "upper limit" value 216 of the jitter window. The jitter controller 206 subtracts the uncertainty value from the 3-times of the new count value 214 in order to produce the "lower limit."

In the decision block 208, the old count value 210 is compared with the upper limit 218 and lower limit 216. If the old count value 212 is between the upper limit 218 and the lower limit 216, a "match" signal 220 is generated by the decision block 208. This match signal 220 indicates that a timing sequence of 3 time units followed by 1 time unit was found, which is only possible in the "M" or "X" preamble (3T-3T-1T-1T) according to the IEC60958 standard.

The divide-by-2 & latch 202 waits for the match signal 220. When the divide-by-2 & latch 202 detects the match signal 220, the new count value 212 is divided by 2 and latched into the output register as the 1T value 224.

According to a further aspect of the present invention, the 1T cycle detector 122 also reports the occurrence of a bad input stream 112 to the system control software 120. In a preferred embodiment, the 1T cycle detector 122 notifies the system control software of a bad signal using a bad signal interrupt 136. The bad signal Interrupt 136 is generated if any of the following conditions occur:

edge-to-edge interval of 4T or longer is detected, a 3T edge-to-edge interval appears in a data window, a preamble is not detected when expected, and a preamble is detected at a wrong position.

Decoder 126

Referring again to FIG. 5, while the 1T cycle detector 122 is processing the input stream 112 and updating the 1T value 224, the decoder module 126 decodes the input stream 112 using the 1T value 224. The decoder module 126 includes shift registers (not shown) for storing the polarity of the input stream 112 when the 1T interval lapses. The shift registers are of sufficient size to store the preamble pattern. The data shift registers are constantly compared with the patterns of the B, M, and W preambles to identify the start of sub-frames. When the decoder module 126 detects a preamble, a preamble start signal is sent to the counter module 130.

Counter Module 130

The function of the counter module 130 is to report the frequency of the input stream 112 to the system control software 120. According to the present invention, the counter module 130 uses either the system clock 114 or the audio clock 116 in order to calculate the input stream 112 frequency, as instructed by the system control software 120. The counter module 130 uses a system clock counter register 140, an audio clock register 141, and a sub-frame counter register 142, respectively, to count the system clock 114 or the audio clock 116 cycles while simultaneously counting the sub-frames from the input stream 112.

One feature of the present invention is that it maximizes the utilization of the system clock counter register 140 or the audio clock counter register 141 because the more bits used in the counter 140, the more precise the timing measurement will be. The count is maximized by maintaining the counting for as many frames as possible. Using the number of clock cycles counted during past frames, it determines when to stop counting by adding that count to the current value of the system clock counter register 140 or the audio clock counter register 141 at the beginning of each frame to determine if the counter 140 will overflow or not by the end of the frame. If the counter register 140 or 141 will not overflow, then counting continues. Otherwise, the counter register 140 or 141 is deemed full and counting ends.

When the clock counter register 140 or 141 becomes full, the values of the clock counter register 140 or 141 and the sub-frame counter register 142 are reported to the system control software 120. The counter module 130 also compares the values of the clock counter register 140 or 141 and the sub-frame counter register 142 with expected values indicated by the system control software 120. If the differences pass a predetermined threshold, then the counter module 130 generates a counter interrupt 132 to notify the system control software 120 of a change in the input stream 112 sampling frequency.

Input Stream Frequency Calculation

The system control software 120 calculates the frame or sample frequency of the input stream 112 using the values of the clock counter register 140 or 141 and sub-frame counter register 142 and the frequency of whichever clock, the system clock 114 or audio clock 116 that was used to perform the counting. More specifically, the sample frequency is determined by:

Sample Freq.=(sub-frame counter value/2*clock counter value))* clock frequency.

Based on the calculated sample frequency, the system control software 120 uses the clock frequency control (fxck) signal 134 to speed up or slow down the audio clock 116.

A method and system for decoding a biphase-mark signal has been disclosed that uses a software controlled frequency locked loop to synchronize an audio out module with a receiver module. The present invention has been described in accordance with the embodiments shown, and one of ordinary skill in the art will readily recognize that there could be variations to the embodiments, and any variation would be within the spirit and scope of the present invention. Accordingly, many modifications may be made by one of ordinary skill in the art without departing from the spirit and scope of the appended claims.

We claim:

1. A biphase-mark decoding system, comprising:
    a programmable clock;
    a data buffer;
    a receiver module coupled to the data buffer for,
        receiving an external biphase-mark input stream,
        recovering timing information from the input stream, and
        decoding the input stream to generate decoded data and storing
        the decoded data in the data buffer;
    an audio out module coupled to the buffer and the programmable clock for reading the decoded data from the data buffer at a rate determined by the programmable clock; and
    a processor coupled to the receiver module for executing a software-based frequency locked loop that uses the timing information from the receiver module to calculate a sampling frequency of the input stream, and then adjusts a frequency of the programmable clock to substantially match the sampling frequency so that the audio out module reads the decoded from the buffer at substantially the same rate that the receiver module inputs the decoded data into the data buffer.

2. The system of claim 1 further including a system clock coupled to the receiver module.

3. The system of claim 2 wherein the programmable clock is coupled to the receiver module and the receiver module uses either the programmable clock or system clock to determine the timing information from the input stream.

4. The system of claim 3 wherein the system clock is capable of significantly higher frequencies than the programmable clock.

5. The system of claim 3 wherein the system clock is used to determine the timing information of the input stream at system startup, thereafter the programmable clock may be used.

6. The system of claim 1 wherein the frequency locked loop is implemented by system control software executed by the processor.

7. The system of claim 1 wherein the receiver module extracts 1T timing from the input stream using only "M" or "X" preamble patterns.

8. The system of claim 7 wherein the receiver module identifies the "M" or "X" preamble by two consecutive 3T intervals followed by two 1T intervals.

9. The system of claim 8 wherein the receiver module utilizes an adaptive jitter tolerance window for accepting clock edges in the input stream that arrive early or late.

10. The system of claim 9 wherein the jitter window is established by measuring 1T timing as a predefined number of system clock cycles, and then dividing the predefined number clock cycles by any number divisible by two as a cost-effective method to provide a jitter window that is proportionate to the input sampling frequency.

11. The system of claim 10 wherein the receiver module further includes a 1T cycle detector and jitter filter logic for establishing 1T timing of the input stream.

12. The system of claim 11 wherein the jitter window is defined by determining a lower and upper limit of the 1T interval, which is adjustable by system control software executing on the processor, and the 1T cycle detector determines a 1T timing value based on the lower and upper limit.

13. The system of claim 12 wherein the 1T cycle detector measures a time interval between edge transitions in the input stream 112 by counting a number of system clock cycles that occur between transitions of adjacent rising edges or adjacent falling edges in the input stream.

14. The system of claim 2 wherein the timing information used to calculate the sampling frequency includes a count of a number of system clock cycles or programmable clock cycles, and a count of a number of sub-frames detected in the input stream.

15. The system of claim 14 wherein the receiver module uses a clock counter register to maintain a count of number of system clock cycles or programmable clock cycles, and uses a sub-frame counter register to maintain a count of sub-frames occurring in the input stream.

16. The system of claim 15 wherein values of the clock counter register and the sub-frame counter register are reported to the system control software when the clock counter register is full.

17. The system of claim 16 wherein the system control software calculates the sampling frequency by:
    Sample Freq.=(sub-frame counter value/(2*clock counter value))* clock frequency.

18. The system of claim 17 wherein the receiver module compares the values of the clock counter register and the sub-frame counter register with expected values indicated by the system control software, and if the differences pass a predetermined threshold, then the receiver module generates an interrupt to notify the system control software of a change in the input stream frequency.

19. The system of claim 2 wherein the receiver module reports an occurrence of a bad input stream to the system control software using a bad signal interrupt.

20. The system of claim 19 wherein the bad signal interrupt is generated if any predefined conditions occur, including;
    edge-to-edge interval of 4T or longer is detected,
    a 3T edge-to-edge interval appears in a data window,
    a preamble is not detected when expected, and
    a preamble is detected at a wrong position.

21. A method for decoding a biphase-mark input stream, comprising:
    (a) receiving an external biphase-mark input stream by a receiver module;
    (b) recovering timing information from the input stream;
    (c) decoding the input stream to generate decoded data and storing the decoded data in a data buffer;
    (d) reading, by an audio out module, the decoded data from the data buffer at a rate determined by a programmable clock;
    (e) using the timing information from the receiver module to calculate a sampling frequency of the input stream; and
    (f) adjusting a frequency of the programmable clock to substantially match the sampling frequency so that the audio out module reads the decoded data from the buffer at substantially the same rate that the receiver module inputs the decoded data into the data buffer.

22. The method of claim 21 further including the step of: calculating the sampling frequency using a software-based frequency locked loop.

23. The method of claim 22 further including the step of: coupling a system clock to the receiver module.

24. The method of claim 23 further including the step of: using either the programmable clock or the system clock to determine the timing information from the input stream.

25. The method of claim 24 wherein the system clock is capable of significantly higher frequencies than the programmable clock.

26. The method of claim 25 further including the step of using the system clock to determine the timing information of the input stream at method startup, and thereafter optionally using a programmable clock.

27. The method of claim 21 wherein the receiver module extracts 1T timing from the input stream using only "M" or "X" preamble patterns.

28. The method of claim 27 wherein the receiver module identifies the "M" or "X" preamble by two consecutive 3T intervals followed by two 1T intervals.

29. The method of claim 28 further including the step of: using an adaptive jitter tolerance window for accepting clock edges in the input stream that arrive early or late.

30. The method of claim 29 further including the step of: establishing the jitter window by measuring 1T timing as a predefined number of system clock cycles, and then dividing the predefined number of clock cycles by any number divisible by two to provide a jitter window that is proportional to the input sampling frequency.

31. The method of claim 21 wherein the timing information used to calculate the sampling frequency includes a count of a number of system clock cycles or programmable clock cycles, and a count of a number of sub-frames detected in the input stream.

32. The method of claim 31 wherein the method control software calculates the sampling frequency by:

Sample Freq.=(sub-frame counter value/(2*clock counter value))* clock frequency.

33. The method of claim 32 wherein the receiver module compares the values of the clock counter register and the sub-frame counter register with expected values indicated by the method control software, and if the differences pass a predetermined threshold, then the receiver module generates an interrupt to notify the method control software of a change in the input stream frequency.

34. The method of claim 21 wherein the receiver module reports an occurrence of a bad input stream to the method control software using a bad signal interrupt.

35. The method of claim 34 further including the step of: generating the bad signal interrupt if any predefined conditions occur, including;

edge-to-edge interval of 4T or longer is detected, a 3T edge-to-edge interval appears in a data window, a preamble is not detected when expected, and a preamble is detected at a wrong position.

36. A biphase-mark decoding system, comprising:

a system clock;

a audio clock;

a data buffer;

a receiver module coupled to the system clock, the audio clock, and the data buffer, the receiver module for receiving an external biphase-mark input stream, recovering timing information from the input stream using either the system clock or the audio clock, and decoding the input stream to generate decoded data and storing decoded data in the data buffer;

an audio out module coupled to the data buffer and the audio clock for reading the decoded data from the data buffer at a rate determined by the audio clock and for generating output data; and a processor coupled to the receiver module and the audio clock for executing control software that implements a frequency locked loop, whereby the control software receives the timing information from the receiver module and uses the timing information as an error measurement to continually adjust a frequency of the audio clock to cause the audio out module to read the decoded data from the data buffer at substantially the same rate that the decoder inputs the decoded data to the data buffer.

37. The system of claim 36 wherein the control software calculates a sampling frequency from the timing information and adjusts the frequency of the audio clock to substantially match the sampling frequency.

38. The system of claim 36 wherein the timing information includes a count of a number of system clock cycles and a count of a number of sub-frames detected in the input stream.

39. The system of claim 36 wherein the timing information includes a count of a number of programmable audio clock cycles and a count of a number of sub-frames detected in the input stream.

* * * * *